(12) United States Patent
Hietala et al.

(10) Patent No.: US 7,474,878 B1
(45) Date of Patent: Jan. 6, 2009

(54) CLOSED LOOP POLAR MODULATION SYSTEM WITH OPEN LOOP OPTION AT LOW POWER LEVELS

(75) Inventors: Alexander Wayne Hietala, Phoenix, AZ (US); Niels Jorgen Jensen, Pandrup (DK); Scott Robert Humphreys, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 589 days.

(21) Appl. No.: 11/070,704

(22) Filed: Mar. 2, 2005

(51) Int. Cl.
*H01Q 11/12* (2006.01)
*H04B 1/04* (2006.01)

(52) U.S. Cl. .............. 455/126; 455/127.1; 455/180.3; 455/183.1; 375/294; 375/327

(58) Field of Classification Search .......... 455/121, 455/126.1, 127.1, 127.2, 102, 108, 110, 126, 455/180.3, 183.1, 91, 123, 522, 136, 67.11, 455/67.13, 67.16, 42, 147, 260, 164.1, 182.1, 455/76, 165.1; 375/144–145, 149, 294–305, 375/308, 327, 345, 376; 332/144, 145, 149, 332/300, 302; 327/147, 156, 105; 330/129, 330/136, 141, 149, 151, 286; 370/344, 347

See application file for complete search history.

(56) References Cited

U.S. PATENT DOCUMENTS

| | | | |
|---|---|---|---|
| 4,965,531 A | 10/1990 | Riley | |
| 5,825,257 A | 10/1998 | Klymyshyn et al. | ......... 332/100 |
| 6,366,177 B1 | 4/2002 | McCune et al. | |
| 6,377,784 B2 | 4/2002 | McCune | |
| 6,396,355 B1 | 5/2002 | Rezin | |
| 6,526,265 B1 | 2/2003 | Damgaard et al. | |
| 6,671,500 B2 | 12/2003 | Damgaard et al. | |
| 6,693,468 B2 | 2/2004 | Humphreys et al. | |
| 6,710,664 B2 | 3/2004 | Humphreys et al. | |
| 6,724,265 B2 | 4/2004 | Humphreys | |
| 6,731,145 B1 | 5/2004 | Humphreys et al. | |
| 6,753,735 B2 | 6/2004 | Arai et al. | ................... 330/297 |
| 6,792,282 B1 | 9/2004 | Domino et al. | ............. 455/522 |
| 6,801,784 B1 | 10/2004 | Rozenblit et al. | ........... 455/522 |
| 6,806,786 B1 | 10/2004 | Lam et al. | |
| 6,834,084 B2 | 12/2004 | Hietala | ...................... 375/296 |
| 6,838,951 B1 | 1/2005 | Nieri et al. | |
| 7,010,276 B2 | 3/2006 | Sander et al. | |
| 7,158,494 B2 | 1/2007 | Sander et al. | |
| 7,209,717 B2 * | 4/2007 | Okada et al. | ................. 455/126 |
| 7,230,997 B2 * | 6/2007 | Kurakami et al. | ........... 375/297 |

(Continued)

OTHER PUBLICATIONS

Andraka, Ray. "A survey of CORDIC algorithms for FPGA based computers," 1998.

(Continued)

*Primary Examiner*—Pablo N Tran
(74) *Attorney, Agent, or Firm*—Withrow & Terranova, P.L.L.C.

(57) ABSTRACT

A polar transmitter that is configurable as either a closed loop polar transmitter or an open loop polar transmitter is provided. In general, the polar transmitter is configured as an open loop polar transmitter when operating at an output power level less than a predetermined threshold and as a closed loop polar transmitter when operating at an output power greater than the predetermined threshold.

16 Claims, 4 Drawing Sheets

U.S. PATENT DOCUMENTS

2003/0215025 A1     11/2003   Hietala .................. 375/297
2003/0215026 A1     11/2003   Hietala .................. 375/297

OTHER PUBLICATIONS

Volder, Jack E. "The CORDIC Trigonometric Computing Technique," IRE Transacions on Electronic Computers, 1959.

Strange, Jon et al., "A Direct Conversion Transceiver for Multi-Band GSM Application," IEEE Radio Frequency Integrated Circuits Symposium, 2000.

Shu, Zhinian et al., "A 2.4-GHz Ring-Oscillator-Based CMOS Frequency Synthesizer With a Fractional Divider Dual-PLL Architecture," IEEE Journal of Solid-State Circuits, vol. 39, No. 2, Mar. 2004, pp. 452-461.

* cited by examiner

CLOSED LOOP POLAR MODULATION SYSTEM WITH OPEN LOOP OPTION AT LOW POWER LEVELS

FIELD OF THE INVENTION

The present invention relates to a polar modulator for a radio frequency wireless transmitter, and more particularly relates to a closed loop polar modulator that is reconfigured as an open loop polar modulator when operating at low output power levels.

BACKGROUND OF THE INVENTION

The Global System for Mobile Communication (GSM) cellular system has recently begun service using a new modulation standard referred to as Enhanced Data rates for GSM Evolution (EDGE). This standard uses 8-Level Phase Shift Keying (8PSK) modulation. Transmitters operating according to the EDGE standard must include a modulator providing both amplitude modulation and phase modulation. To efficiently amplify such modulation, a polar system is desirable.

Polar transmitters may be classified as either open loop or closed loop. In an open loop polar transmitter, a transmit signal is broken into amplitude and phase components. The phase component is provided to the radio frequency (RF) input of a power amplifier. The amplitude component may be used to vary the supply voltage, or collector voltage, of the power amplifier such that the output power of the power amplifier follows the instantaneous amplitude of the modulation envelope, thereby providing amplitude modulation.

One issue for an open loop polar transmitter is that amplitude modulation to phase modulation (AM/PM) distortion of the power amplifier varies as the supply voltage varies. One solution to this problem is to pre-distort the phase component prior to amplification in order to compensate for the AM/PM distortion of the power amplifier. However, if the Voltage Standing Wave Ratio (VSWR) at the output of the power amplifier changes due to variations in load impedance, then the AM/PM distortion also changes. As a result, the pre-distortion no longer aligns with the AM/PM distortion of the power amplifier. At low output power levels, this is generally not an issue because the spectrum and Error Vector Magnitude (EVM) requirements of the EDGE standard are less stringent for low output power levels. At higher output power levels, this may become more of an issue because the spectrum and EVM requirements are more stringent.

A closed loop polar transmitter may be used to solve the issue of AM/PM distortion by enclosing the power amplifier within a phase locked loop (PLL) generating the phase modulation. However, one issue for a closed loop polar transmitter is that strong interference signals present at the antenna are fed back to the PLL along with the output of the power amplifier. If the interference signal is strong enough, the interference signal will overpower the feedback from the output of the power amplifier and cause the PLL to unlock. As a result, the output of the polar transmitter is severely distorted.

Thus, there remains a need for a polar transmitter that provides improved spectral purity at higher output levels and that prevents unlocking of the PLL used to generate the phase component due to strong interference signals.

SUMMARY OF THE INVENTION

The present invention provides a polar transmitter that is configurable as either a closed loop polar transmitter or an open loop polar transmitter. In general, the polar transmitter is configured as an open loop polar transmitter when operating at an output power level less than a predetermined threshold and as a closed loop polar transmitter when operating at an output power greater than the predetermined threshold.

The polar transmitter includes a polar modulator that modulates data to provide an amplitude modulation signal and a phase modulation signal. The polar modulator includes a phase locked loop (PLL) that generates the phase modulation signal. When operating as an open loop polar transmitter, switching circuitry couples the output of the PLL to an input of a phase detector of the PLL as a feedback signal. As a result, unlocking of the PLL due to strong interference signals is prevented as there is no connection from the antenna to the phase detector input.

When operating as a closed loop polar transmitter, coupler circuitry generates a signal corresponding to the output signal of the polar transmitter provided to the antenna. The switching circuitry couples the output of the coupler circuitry to the input of the phase detector as the feedback signal. Accordingly, when operating as a closed loop polar transmitter, a power amplifier of the polar transmitter, and thus the phase distortion of the power amplifier, is enclosed within the PLL such that the phase distortion of the power amplifier is essentially removed from the output of the polar transmitter.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
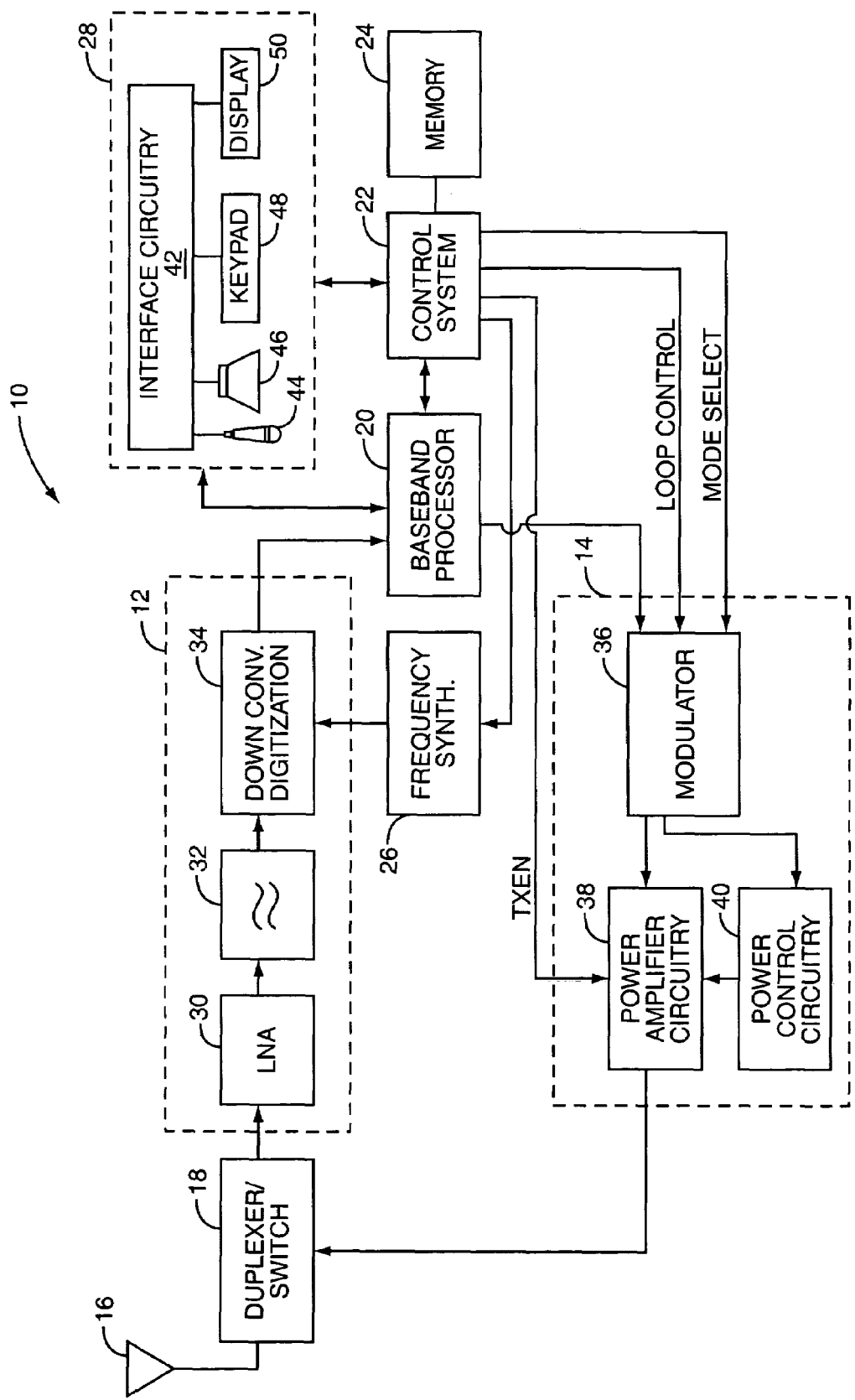
FIG. 1 is a exemplary block diagram of a mobile terminal according to one embodiment of the present invention.

The present invention is preferably incorporated in a mobile terminal 10, such as a mobile telephone, personal digital assistant, wireless Local Area Network (LAN) device, a base station in a mobile network, or the like. The basic architecture of a mobile terminal 10 is represented in FIG. 1, and may include a receiver front end 12, a radio frequency transmitter section 14, an antenna 16, a duplexer or switch 18, a baseband processor 20, a control system 22, memory 24, a frequency synthesizer 26, and an interface 28. The receiver front end 12 receives information bearing radio frequency signals from one or more remote transmitters provided by a base station (not shown). A low noise amplifier 30 amplifies the signal. A filter circuit 32 minimizes broadband interference in the received signal, while a downconverter 34 downconverts the filtered, received signal to an intermediate or baseband frequency signal, which is then digitized into one or more digital streams. The receiver front end 12 typically uses one or more mixing frequencies generated by the frequency synthesizer 26.

The baseband processor 20 processes the digitized, received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data from the control system 22, which it encodes for transmission. The control system 22 may run software stored in the memory 24. Alternatively, the operation of the control system 22 may be a function of sequential logic structures as is well understood. After encoding the data from the control system 22, the baseband processor 20 outputs the encoded data to the radio frequency transmitter section 14.

A modulator 36 receives the data from the baseband processor 20 and operates according to one or more modulation schemes to provide a modulated signal to the power amplifier circuitry 38. The modulation scheme of the modulator 36 is controlled by a mode select signal (MODE SELECT) from the control system 22. In one embodiment, the modulator 36 operates according to either an 8-Level Phase Shift Keying (8PSK) modulation scheme, which is a modulation scheme containing both amplitude and phase components, or a Gaussian Minimum Shift Keying (GMSK) modulation scheme, which is a constant amplitude modulation scheme.

When in 8PSK mode, the modulator 36 provides a phase component ($\phi$) at a desired transmit frequency to the power amplifier circuitry 38 and an amplitude component (r) to the power control circuitry 40. The power control circuitry 40 controls an output power of the power amplifier circuitry 38 based on the amplitude component (r) or, optionally, a combination of a ramping signal and the amplitude component (r), thereby providing amplitude modulation of the phase component ($\phi$). When in GMSK mode, the modulator provides a phase modulated signal to the power amplifier circuitry 38 and the ramping signal to the power control circuitry 40, where the power control circuitry 40 controls the output power of the power amplifier circuitry 38 based on the ramping signal.

The power amplifier circuitry 38 amplifies the modulated signal from the modulator 36 to a level appropriate for transmission from the antenna 16. A gain of the power amplifier circuitry 38 is controlled by the power control circuitry 40. In essence, the power control circuitry 40 operates to control a supply voltage provided to the power amplifier circuitry 38 based on the amplitude component (r) or, optionally, a combination of the amplitude component (r) and the ramping signal from the modulator 36 when in the 8PSK mode and based on the ramping signal when in GMSK mode.

A user may interact with the mobile terminal 10 via the interface 28, which may include interface circuitry 42 associated with a microphone 44, a speaker 46, a keypad 48, and a display 50. The interface circuitry 42 typically includes analog-to-digital converters, digital-to-analog converters, amplifiers, and the like. Additionally, it may include a voice encoder/decoder, in which case it may communicate directly with the baseband processor 20.

The microphone 44 will typically convert audio input, such as the user's voice, into an electrical signal, which is then digitized and passed directly or indirectly to the baseband processor 20. Audio information encoded in the received signal is recovered by the baseband processor 20, and converted into an analog signal suitable for driving speaker 46 by the interface circuitry 42. The keypad 48 and display 50 enable the user to interact with the mobile terminal 10, input numbers to be dialed and address book information, or the like, as well as monitor call progress information.

Figure 2:
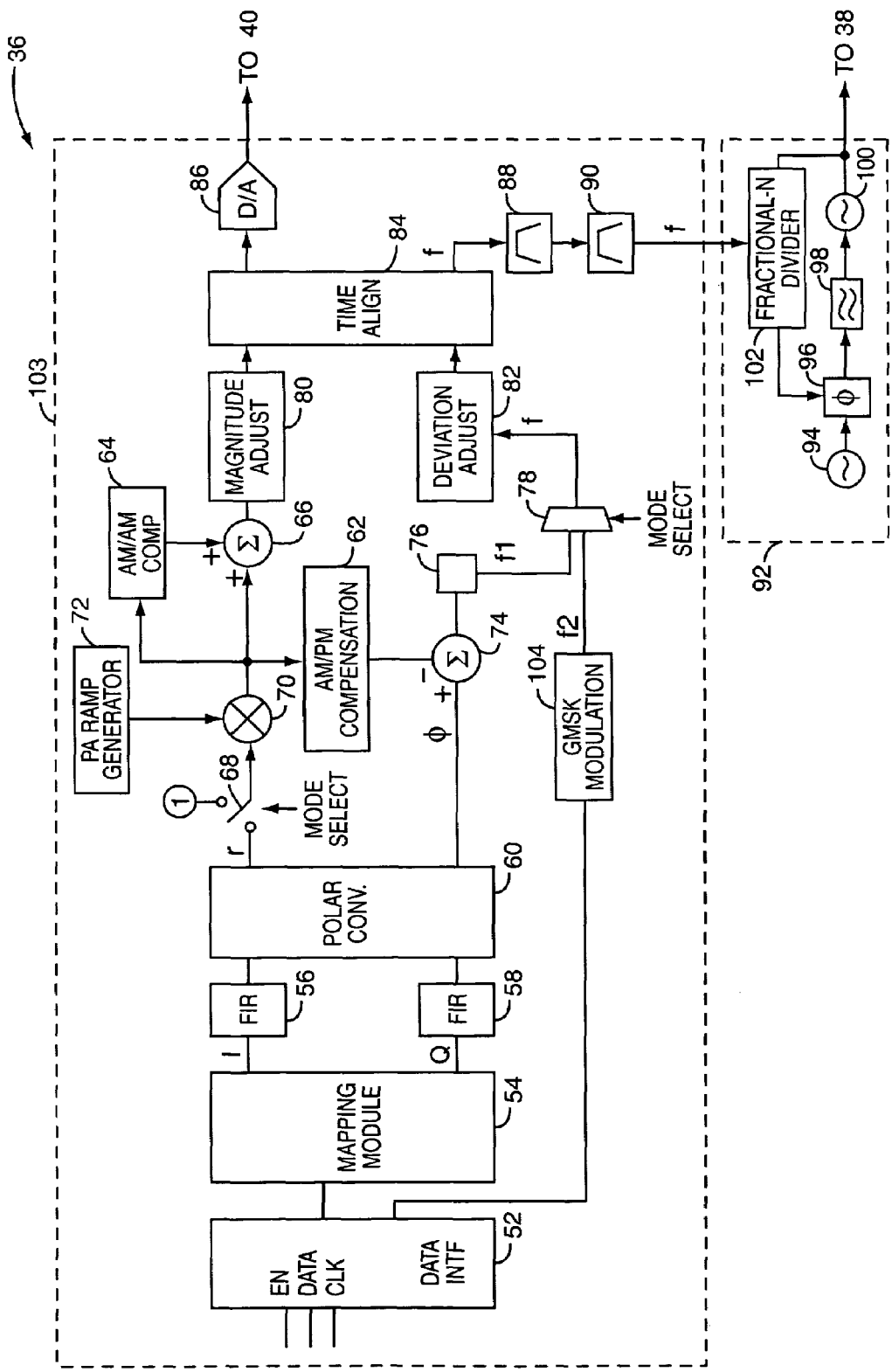
FIG. 2 illustrates an exemplary modulator for an open loop transmitter.

FIG. 2 illustrates an exemplary embodiment of the modulator 36 wherein the modulator 36 operates in either an 8PSK (8-level Phase Shift Keying) mode or GMSK (Gaussian Minimum Shift Keying) mode. It should be noted that 8PSK and GMSK are exemplary modulation schemes and are not intended to limit the scope of the present invention. The modulator 36 includes several components, including a data interface 52, a mapping module 54, first and second filters 56, 58, and a polar converter 60. Other components of the modulator 36 will be discussed below. It should be noted that the data interface 52 may include First In First Out (FIFO) circuitry or may alternatively be a real time serial data interface.

The mapping module 54, the filters 56, 58, and the polar converter 60 form an 8PSK modulator. As discussed below, in this embodiment, the 8PSK modulator also includes amplitude modulation to phase modulation (AM/PM) compensation circuitry 62, amplitude modulation to amplitude modulation (AM/AM) compensation circuitry 64, and various other components as described below.

When in 8PSK mode, the data interface 52 receives data from the baseband processor 20 (FIG. 1) at the bit rate of the system. This data is passed to the mapping module 54, where the data is grouped into symbols of three consecutive data bits, Grey coded, and rotated by $3\pi/8$ on each symbol as per European Telecommunications Standards Institute (ETSI) specifications. The resulting symbol is mapped to one of sixteen points in an in-phase (I), quadrature phase (Q) constellation.

Both the in-phase (I) and the quadrature phase (Q) components for each point are then filtered by the first and second filters 56, 58, respectively. In an exemplary embodiment, the first and second filters 56, 58 are EDGE finite impulse response (FIR) filters. This, as dictated by the ETSI specifications, shapes the response between symbol times.

After filtering, both the in-phase (I) and the quadrature phase (Q) components are sent to the polar converter 60. The polar converter 60 uses a classical coordinate rotation digital computer (CORDIC) algorithm or like rectangular to polar conversion technique. Thus, the polar converter 60 generates phase ($\phi$) and amplitude (r) equivalent signals. Further information about CORDIC algorithms may be found in *Proceedings of the 1998 ACM/SIGDA Sixth International Symposium On Field Programmable Gate Arrays* by Ray Andraka, Feb. 22-24, pp. 191-200 and "The CORDIC Trigonometric Computing Technique" by Jack E. Volder *IRE Trans on Elect. Computers*, p. 330, 1959, both of which are hereby incorporated by reference in their entireties.

The amplitude signal (r) is split and directed to the AM/PM compensation circuitry 62, the AM/AM compensation circuitry 64, and summation circuitry 66 via switch 68. The switch 68 is controlled by the mode select signal (MODE SELECT) such that the switch 68 couples the output of the polar converter 60 to a multiplier 70. The multiplier 70 combines the amplitude signal (r) with a ramping signal ($V_{RAMP}$) generated by a power amplifier (PA) ramp generator 72. Thereafter, the amplitude signal from the multiplier 70 is directed to the AM/PM compensation circuitry 62, the AM/AM compensation circuitry 64, and summation circuitry 66.

The AM/PM compensation circuitry 62 introduces a compensation term to the phase signal via subtraction circuitry 74 that, after further processing, counteracts the distortion introduced by AM to PM conversion in the power amplifier circuitry 38. The AM/AM compensation circuitry 64 introduces a compensation term to the amplitude signal via the summation circuitry 66 that, after further processing, counteracts the distortion introduced by AM to AM conversion in the power amplifier circuitry 38. Further details of the AM/PM compensation circuitry 62 and the AM/AM compensation circuitry 64 can be found in commonly owned and assigned U.S. Patent Application Publication No. 2003/0215025, entitled AM TO PM CORRECTION SYSTEM FOR POLAR MODULATOR, published Nov. 20, 2003; and U.S. Patent Application Publication No. 2003/0215026, entitled AM TO AM CORRECTION SYSTEM FOR POLAR MODULATOR, published Nov. 20, 2003, both of which are hereby incorporated by reference in their entireties.

The output of the subtraction circuitry 74, which is referred to herein as a combined signal, is directed to a phase to frequency converter 76. The output of the phase to frequency converter 76 is a frequency signal (f1), which generally corresponds to the desired frequency deviation of the modulated signal. The frequency signal (f1) is provided to a multiplexer switch 78, which is controlled by the mode select signal (MODE SELECT). When in the 8PSK mode, the mode select signal is provided such that the multiplexer switch 78 outputs the frequency signal (f1) from the phase to frequency converter 76. Magnitude adjuster 80 and deviation adjuster 82 then adjust the magnitude of the amplitude signal (r) and the frequency deviation of the frequency signal (f), respectively, to a level expected by a time aligner 84, such that they comply with the appropriate standard. Next, a relative time delay is applied as necessary to the signals for best Error Vector Magnitude (EVM) and spectrum by the time aligner 84, such that the time aligner 84 provides the amplitude signal (r) and a frequency signal (f). The frequency signal (f) is a magnitude adjusted, time aligned version of the output of the multiplexer switch 78. Because these are preferably digital components, concerns about variations in analog components and the corresponding variation in time delays downstream are minimized.

At this point, the amplitude signal (r) and the frequency signal (f) separate and proceed by different paths, an amplitude signal processing path and a frequency signal processing path, to the power amplifier circuitry 38. With respect to the amplitude signal processing path, when in the 8PSK mode, the amplitude signal (r) is provided to a digital-to-analog (D/A) converter 86, which converts the digital amplitude signal (r) from the time aligner 84 to an analog power control signal. The analog power control signal is used by the power control circuitry 40 to set the collector voltage on the power amplifier circuitry 38. As the amplitude signal (r) changes, the voltage at the power amplifier circuitry 38 collector changes, and the output power will vary as $V^2/R_{out}$ ($R_{out}$ is not shown, but is effectively the load on the power amplifier circuitry 38). This is sometimes known as "plate modulation".

The frequency signal (f) from the time aligner 84 is directed to a digital filter 88 and a digital predistortion filter 90. Thereafter, the frequency signal (f), which is a digital signal, is provided to a phase locked loop (PLL) 92 to provide direct digital modulation similarly to that described in commonly owned and assigned U.S. Pat. No. 6,834,084, entitled DIRECT DIGITAL POLAR MODULATOR, issued Dec. 21, 2004, which is hereby incorporated herein by reference in its entirety. In one embodiment, the data interface 52 provides a digital data interface to the baseband processor 20, and the entire phase path from the data interface 52 to the PLL 92 is a digital path.

Based on the frequency signal (f), the PLL 92 generates an output at the desired radio frequency. In the exemplary embodiment illustrated, the PLL 92 includes a reference oscillator 94, a phase detector 96, a loop filter 98, a voltage controlled oscillator (VCO) 100, and a fractional-N divider 102. The operational details of the PLL 92 will be apparent to one of ordinary skill in the art upon reading this disclosure. In general, the phase detector 96 compares a phase of a reference signal provided by the reference oscillator 94 with a divided signal provided by the fractional-N divider 102. Based on the comparison of the reference signal and the divided signal, the phase detector 96 provides a detection signal to the loop filter 98. The loop filter 98, which is a low pass filter, operates to filter the detection signal to provide a control signal to the VCO 100.

The modulator 36 also includes a GMSK modulator, which includes the GMSK modulation circuitry 104. When in GMSK mode, the GMSK modulation circuitry 104 processes the data to generate a frequency signal (f2). In one embodiment, the GMSK modulation circuitry 104 is a look-up table. Another exemplary embodiment of the GMSK modulation circuitry 104 is discussed in U.S. Pat. No. 5,825,257, entitled GMSK MODULATOR FORMED OF PLL TO WHICH CONTINUOUS MODULATED SIGNAL IS APPLIED, issued Oct. 20, 1998, which is hereby incorporated by reference in its entirety. It should be appreciated that other embodiments of the GMSK modulation circuitry 104 may also be used, and the particular circuitry is not central to the present invention.

The output of the GMSK modulation circuitry 104, which is the frequency signal (f2), is provided to the multiplexer switch 78. In GMSK mode, the multiplexer switch 78 outputs the frequency signal (f2) from the GMSK modulation circuitry 104. As discussed above, the adjusters 80, 82 then adjust the magnitude of the amplitude signal (r) and the deviation of the frequency signal (f2), respectively, to levels expected by the time aligner 84, such that they comply with the appropriate standard. Next, a relative time delay is applied as necessary to the signals for best Error Vector Magnitude (EVM) and spectrum by the time aligner 84.

At this point, the amplitude signal (r) and the frequency signal (f) output by the time aligner 84 separate and proceed by different paths to the power amplifier circuitry 38. With respect to the amplitude signal processing path, when in the GMSK mode, the switch 68 is controlled such that a unity signal is provided to the multiplier 70. Accordingly, the multiplier 70 multiplies the ramping signal ($V_{RAMP}$) from the PA ramp generator 72 by 1 to provide the amplitude signal processed by the AM/AM compensation circuitry 64, the summation circuitry 66, the magnitude adjuster 80, and the time aligner 84 to provide the amplitude signal (r), which is also referred to as a digital power control signal. The digital power control signal is converted to the analog power control signal by the digital-to-analog converter 86. The analog power control signal is used by the power control circuitry 40 to set the collector voltage on the power amplifier circuitry 38.

As in 8PSK mode, when in GMSK mode, the frequency signal (f) from the time aligner 84 is directed to the digital filter 88, the optional digital predistortion filter 90, and the PLL 92. The PLL 92 generates the output at the desired radio frequency. In an exemplary embodiment, the frequency signal is applied to a single port on the fractional-N divider 102 within the PLL 92.

Figure 3:
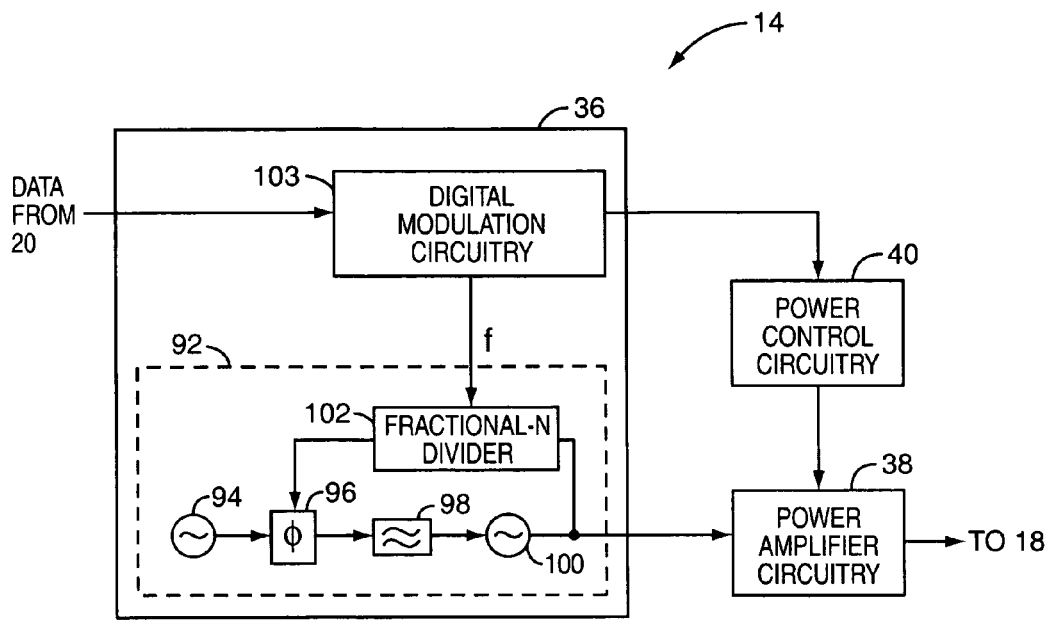
FIG. 3 illustrates an exemplary open loop transmitter including the modulator of FIG. 2.

FIG. 3 illustrates an exemplary embodiment of the radio frequency transmitter section 14 including the modulator 36 of FIG. 2. As illustrated, the modulator 36 includes the PLL 92 and digital modulation circuitry 103. The digital modulation circuitry 103 is shown in more detail in FIG. 2. Since the power amplifier circuitry 38 is not enclosed within the PLL 92, the radio frequency transmitter section 14 is an open loop transmitter. One issue with the open loop radio frequency transmitter section 14 of FIG. 3 is that that load impedance seen at the output of the power amplifier circuitry 38 may vary due to environmental changes such as the user placing the antenna 16 (FIG. 1) near his or her body. As a result, the Voltage Standing Wave Ratio (VSWR) at the output of the power amplifier circuitry 38 changes, and the AM/PM distortion characteristic of the power amplifier circuitry 38 also changes. Because of the change in the AM/PM characteristic of the power amplifier circuitry 38, the AM/PM compensation circuitry 62 may no longer precisely compensate the AM/PM distortion of the power amplifier circuitry 38 such that the output of the power amplifier circuitry 38 contains residual AM/PM distortion.

One solution to this issue is to alter the design of the radio frequency transmitter section 14 of FIG. 3 such that the radio frequency transmitter section 14 is a closed loop transmitter. This could be done by enclosing the power amplifier circuitry 38 within the loop of the PLL 92 such that the phase distortion is removed from the output of the power amplifier circuitry 38.

However, one problem that associated with converting the radio frequency transmitter section 14 of FIG. 3 into a closed loop transmitter by enclosing the power amplifier circuitry 38 within the PLL 92 is that a strong interference signal may be present at the antenna 16 while transmitting. This interference signal may be strong enough to overpower the feedback from the output of the power amplifier circuitry 38 such that the PLL 92 unlocks. As an example, the interference signal may be strong enough to overpower the feedback from the output of the power amplifier circuitry 38 such that the PLL 92 unlocks if the power level of the interference signal is greater than about 6 dB less than the output power level of the power amplifier circuitry 38. However, 6 dB is exemplary and may vary depending on the particular implementation. As a result of the unlocking of the PLL 92, the output of the radio frequency transmitter section 14 would be severely distorted, which would be detrimental to both the mobile terminal 10 and to other radio systems near the mobile terminal 10.

This is particularly an issue when the output power of the power amplifier circuitry 38 is set to a low output power level, and more particularly when the output power is set to a minimum output power level. For example, when operating at a minimum output power level according to the EDGE standard, the average output power may be as low as 0 dBm with minimum envelope excursions, or valleys, dropping to −14 dBm. Thus, for our example, the interference signal seen at the output of the directional coupler 108 would have to be less than −20 dBm to avoid unlocking the PLL 92. Accordingly, if the interference source is a transmitter transmitting at 33 dBm, then a minimum separation between the mobile terminal 10 and the interference source in order to prevent unlocking of the PLL 92 would be more than ten feet. Thus, if the interference signal source is within ten feet of the mobile terminal 10, the interference signal may cause the PLL 92 to unlock on every valley in the modulation, thereby substantially degrading the performance of the mobile terminal 10.

Figure 4:
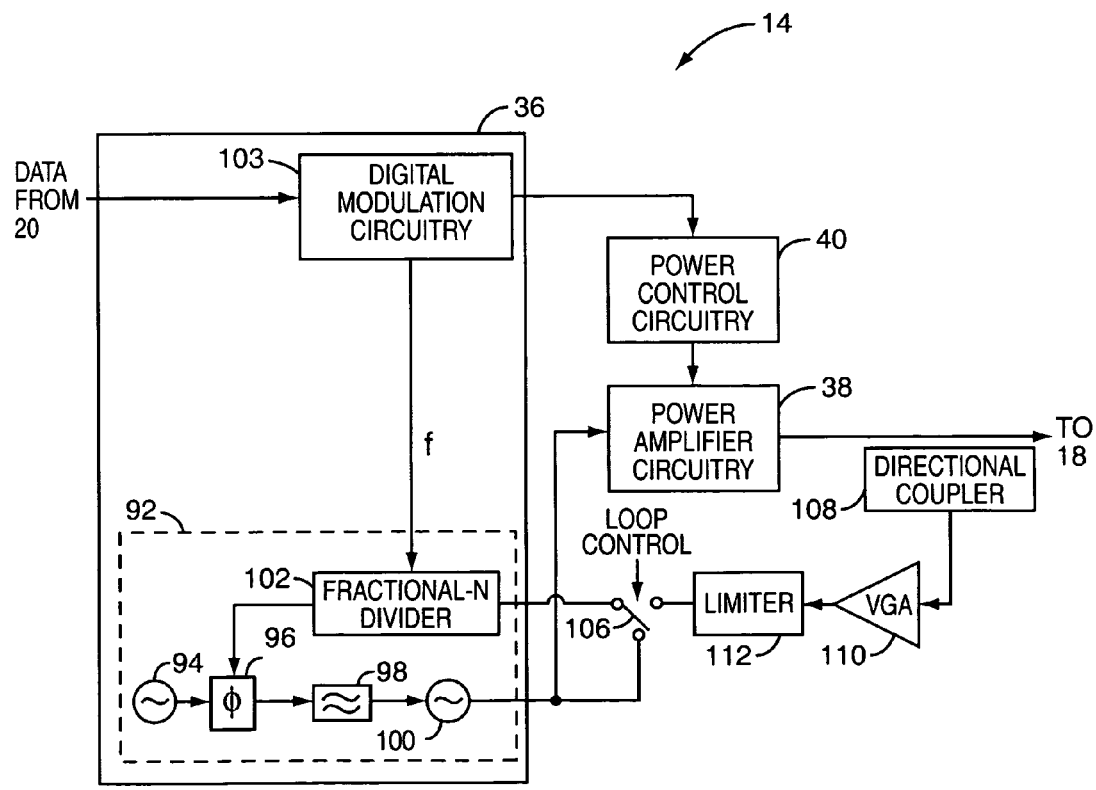
FIG. 4 illustrates an exemplary transmitter configurable as either an open loop polar transmitter or a closed loop polar transmitter according to one embodiment of the present invention.

FIG. 4 is an exemplary embodiment of the radio frequency transmitter section 14 that operates in either a closed loop mode of operation or an open loop mode of operation according to one embodiment of the present invention. For the open loop mode of operation, the loop control signal (LOOP CONTROL) is provided in a first state such that switching circuitry 106 couples the output of the VCO 100 to the input of the fractional-N divider 102 such that the power amplifier circuitry 38 is not enclosed within the PLL 92. For the closed loop mode of operation, a directional coupler 108 provides a feedback signal indicative of the output signal of the power amplifier circuitry 38, as will be apparent to one of ordinary skill in the art upon reading this disclosure. The feedback signal may be processed by a variable gain amplifier (VGA) 110 and limiter 112 and thereafter provided to the switching circuitry 106. For the closed loop mode of operation, the loop control signal (LOOP CONTROL) is provided in a second state such that the switching circuitry 106 provides the feedback signal from the directional coupler 108, which is indicative of the output signal of the power amplifier circuitry 38, to the fractional-N divider 102, thereby enclosing the power amplifier circuitry 38 within the PLL 92.

According to the present invention, the modulator 36 is switched to the open loop mode of operation when the mobile terminal 10 is transmitting at low output power levels, thereby preventing or at least substantially reducing the probability that the PLL 92 will be unlocked due to strong interference signals. When the average output power of the mobile terminal 10 is above a predetermined threshold, the modulator 36 is switched to the closed loop mode of operation. In one embodiment, the threshold is +12 dBm such that the radio frequency transmitter section 14 is configured as an open loop transmitter when the output power level of the mobile terminal 10 is less than 12 dBm and configured as an open loop transmitter when the output of the mobile terminal 10 is greater than or equal to 12 dBm. In another embodiment, the threshold may be in the range of +10 to +15 dBm depending on the particular design.

Figure 5:
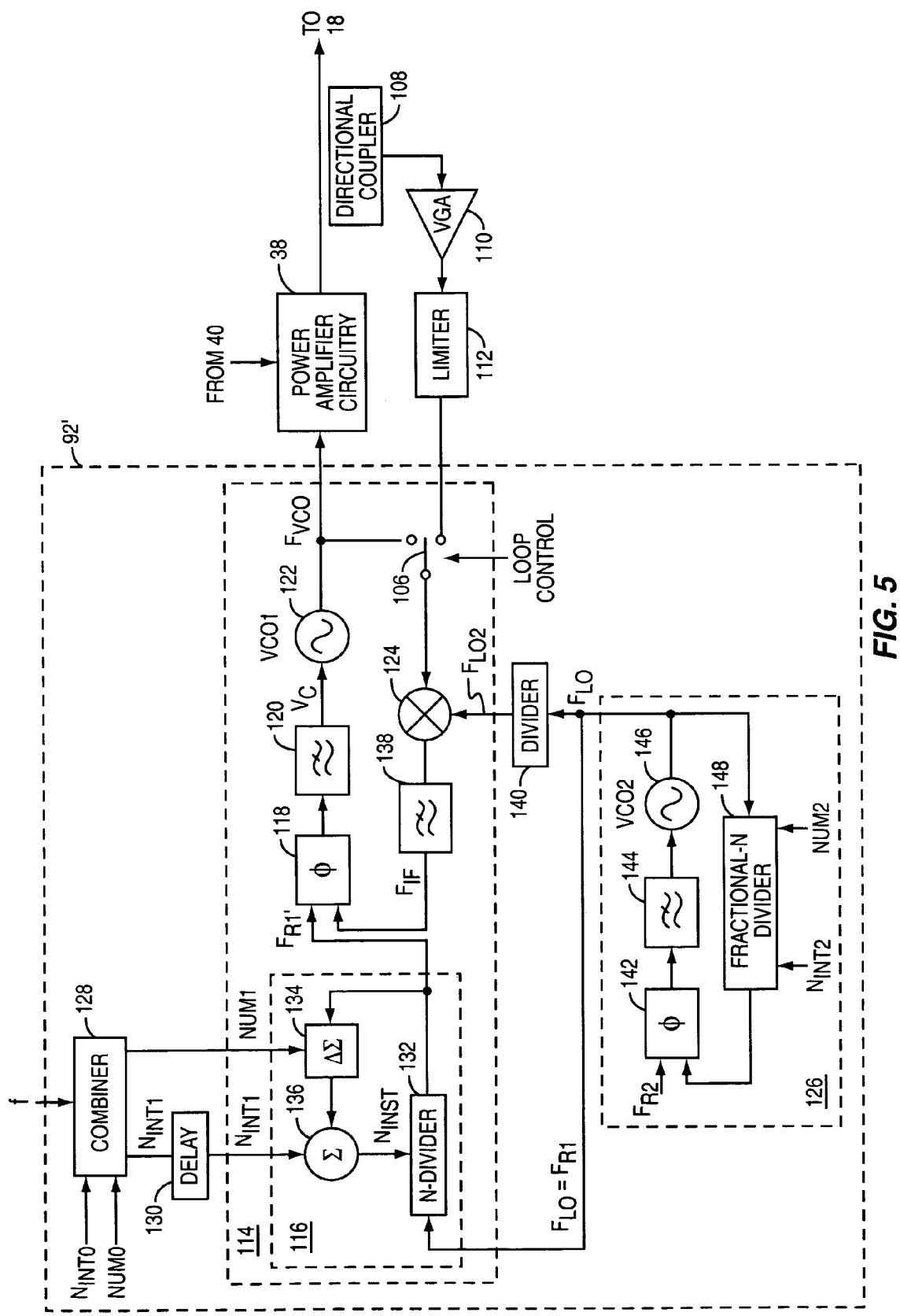
FIG. 5 illustrates an alternative embodiment of a phase locked loop for use in the transmitter of FIG. 4 according to one embodiment of the present invention.

FIG. 5 illustrates another embodiment of the PLL 92 of the modulator 36 of FIG. 4 according to another embodiment of the present invention. In this embodiment, the PLL 92 is a Fractional-N Offset PLL (FN-OPLL) 92' such as that disclosed in commonly owned and assigned U.S. patent application Ser. No. 11/047,258 entitled FRACTIONAL-N OFFSET PHASE LOCKED LOOP, which was filed on Jan. 31, 2005 and is hereby incorporated by reference in its entirety. This may be particularly beneficial because the FN-OPLL 92' may have a loop bandwidth that is significantly larger than the loop bandwidth of the PLL 92 of FIG. 4.

In general, the FN-OPLL 92' includes a first phase locked loop (PLL) 114, which includes a fractional-N divider 116, a phase detector 118, a loop filter 120, a voltage controlled oscillator (VCO) 122, and a mixer 124. The FN-OPLL 92' also includes a second PLL 126. It should be noted that the second PLL 126 may also be used as the frequency synthesizer 26 (FIG. 1) for the mobile terminal 10 when in receive mode. In operation, the fractional-N divider 116 fractionally divides a local oscillator frequency signal ($F_{LO}$), which is the output of the second PLL 126 and a reference frequency ($F_{R1}$) for the first PLL 114, based on an integer value ($N_{INT1}$) and a fractional value (NUM1) to provide reference signal ($F_{R1}'$).

The values $N_{INT1}$ and NUM1 are generated by combiner circuitry 128 based on a modulation signal, which in this embodiment corresponds to the frequency signal (f) from the phase path of the modulator 36 of FIG. 4 and integer and fractional values $N_{INT0}$ and NUM0. The integer and fractional values $N_{INT0}$ and NUM0 define an initial fractional divide value ($N_0$), which corresponds to a desired center or carrier frequency of the output signal ($F_{VCO}$). The integer and fractional values $N_{INT0}$ and NUM0 may be provided by the control system 22 (FIG. 1).

In one embodiment, the combiner circuitry 128 combines the initial fractional divide value ($N_0$) and the modulation signal (f) using the following equation:

$N = N_0 + \text{Modulation}$, where $N = N_{INT1}.\text{NUM1}$, and

N is a combined divider value and "Modulation" is the modulation signal (f). The value $N_{INT1}$ is an integer portion of the combined divider value and NUM is a fractional part of the combined divider value.

The value $N_{INT1}$ is passed to delay circuitry 130 which delays the value $N_{INT1}$ with respect to the value NUM1. As discussed below, the delay ensures that the values $N_{INT1}$ and NUM1 are aligned at a summation node of the fractional-N divider 116.

An exemplary embodiment of the fractional-N divider 116 is also illustrated in FIG. 5, wherein the fractional-N divider 116 includes N-divider circuitry 132, a delta-sigma modulator 134, and summation circuitry 136. The summation circuitry 136 is generally referred to as combiner circuitry and can comprise, for example, a digital binary adder. The operation of the fractional-N divider 116 is known in the art and is not described in detail herein. In general, the fractional-N divider 116 divides the local oscillator signal ($F_{LO}$) by $N_{INT1}.\text{NUM1}$, where $N_{INT1}$ is the integer portion of the combined divide value from the combiner circuitry 128, and NUM1 is the fractional portion of the combined divide value from the combiner circuitry 128. The delay circuitry 130 ensures that the values $N_{INT1}$ and NUM1 are aligned at the summation circuitry 136. Accordingly, an instantaneous divide value ($N_{INST}$) provided to the N-divider circuitry 132 from the summation circuitry 136 is defined as:

$N_{INST} = N_{INT1}(\text{delayed}) + \text{sequence}$, where $N_{INT1}(\text{delayed})$ is the output of the delay circuitry 130, and "sequence" is a current value of a sequence provided by the delta-sigma modulator 134, as will be apparent to one of ordinary skill in the art.

Since the fractional divide value ($N_{INT1}.\text{NUM1}$) of the fractional-N divider 116 is provided by the combiner circuitry 128 based on the modulation signal (f), the local oscillator signal ($F_{LO}$) is fractionally divided based on the modulation signal (f), thereby controlling the output signal ($F_{VCO}$) of the FN-OPLL 92' such that it is a phase or frequency modulated signal. Further, in one embodiment, the modulation signal (f) is a digital signal such that the FN-OPLL 92' provides a digital modulation interface. This is especially beneficial where the phase path of the modulator 36 (FIG. 2) from the data interface 52 (FIG. 2) to the FN-OPLL 92' is entirely a digital path according to one embodiment of the present invention.

The phase detector 118 compares the fractionally divided reference signal ($F_{R1}'$) output by the fractional-N divider 116 to an intermediate frequency signal ($F_{IF}$). The output of the phase detector 118 is filtered by the loop filter 120 and provided to the VCO 122 as a control voltage ($V_C$). The loop filter 120 is designed such that the first PLL 114 has a wide open-loop unity-gain bandwidth. In one embodiment, the first PLL 114 has a bandwidth in the range of 1.2 MHz to 1.5 MHz. Based on the control voltage ($V_C$), the VCO 122 provides the output signal ($F_{VCO}$). As described above with respect to the modulator 36 (FIG. 4), the output of the VCO 122 is the modulated signal and is provided to the power amplifier circuitry 38.

When in the open loop mode of operation, the switching circuitry 106 is controlled such that the output signal ($F_{VCO}$) of the VCO 122 is also provided to a feedback path including the mixer 124 and optionally a feedback filter 138. It should be noted that the switching circuitry 106 is illustrated in FIG. 5 as part of the PLL 92. However, the switching circuitry 106 may be separate from the PLL 92 as in FIG. 4. When in the closed loop mode of operation, the output of the power amplifier circuitry 38 is fed back to the mixer via the direction coupler 108, VGA 110, limiter 112, and switching circuitry 106. The mixer 124 operates to multiply the feedback signal, which is either the output signal ($F_{VCO}$) of the VCO 122 or a feedback signal indicative of the output of the power amplifier circuitry 38, by a divided local oscillator signal ($F_{LO2}$). It should be noted that additional divider circuits may be placed between the VCO 122 and the mixer 124 depending on the particular implementation. The divided local oscillator signal ($F_{LO2}$) is provided by a divider 140, which operates to divide the local oscillator signal ($F_{LO}$) from the second PLL 126 by an integer divide value. The divider 140 may alternatively be a fractional-N divider. It should be noted that the divider 140 is optional, and the local oscillator signal ($F_{LO}$) may alternatively be provided to the mixer 124.

In operation, the mixer 124 multiplies the feedback signal, which has a frequency substantially equal to the frequency $F_{VCO}$, and the divided local oscillator signal ($F_{LO2}$), thereby downconverting the feedback signal to provide the intermediate frequency signal ($F_{IF}$). The output of the mixer 124 may include a high frequency component at a frequency equal to the frequency of the feedback signal plus the frequency of the divided local oscillator signal ($F_{LO2}$) and a low frequency component at a frequency equal to a difference of the frequency of the feedback signal and the frequency of the divided local oscillator signal ($F_{LO2}$), as commonly known. Thus, the output of the mixer 124 may optionally be filtered by the feedback filter 138 to remove the high frequency component and thereby provide the intermediate frequency signal ($F_{IF}$) to the phase detector 118.

An exemplary embodiment of the second PLL 126 is also illustrated in FIG. 5. In this embodiment, the second PLL 126 is a fractional-N PLL and includes a phase detector 142, a loop filter 144, a voltage controlled oscillator (VCO2) 146, and a fractional-N divider 148. In operation, the voltage controlled oscillator 146 provides the local oscillator signal ($F_{LO}$). The local oscillator signal ($F_{LO}$) is fractionally divided by the fractional-N divider 148 to provide a feedback signal to one input of the phase detector 142. A reference frequency ($F_{R2}$), which may be generated by an oscillator, is provided to a second input of the phase detector 142. The phase detector 142 compares the feedback signal to the reference frequency ($F_{R2}$), and an output signal from the phase detector 142 is provided to the loop filter 144. The loop filter 144 filters the output signal from the phase detector 142 to provide a control voltage to the voltage controlled oscillator 146.

In one embodiment, the loop filter 144 has a narrow bandwidth, such as 90 kHz. The frequency of the local oscillator signal ($F_{LO}$) is controlled by an external component, such as the control system 22 (FIG. 1), by controlling the control inputs ($N_{INT2}$ and NUM2) provided to the fractional-N divider 148. Accordingly, the control inputs $N_{INT2}$ and NUM2 may be controlled for channel selection and for spur avoidance.

The present invention provides substantial opportunity for variation without departing from the spirit or scope of the present invention. For example, although the loop control signal is described above as being provided by the control system 22, the loop control signal may be provided by the baseband processor 20 or some other controller based on the desired output power level. As another example, the directional coupler 108 is described for providing the signal corresponding to the output signal of the power amplifier circuitry 38 and is illustrated as coupling to the output of the power amplifier circuitry 38. However, the power amplifier circuitry 38 may include numerous amplifier stages, and any number of the amplifier stages may be enclosed within the PLL 92 during closed loop operation.

Those skilled in the art will recognize improvements and modifications to the preferred embodiments of the present invention. All such improvements and modifications are considered within the scope of the concepts disclosed herein and the claims that follow.

What is claimed is:

1. A system comprising:
a polar transmitter adapted to operate in an open loop mode of operation when an output power level of the polar transmitter is below a predetermined threshold and operate in a closed loop mode of operation when the output power level is above the predetermined threshold; wherein the polar transmitter comprises:
a polar modulator adapted to modulate data to provide an amplitude modulation signal and a phase modulation signal, the polar modulator comprising a phase locked loop (PLL) providing the phase modulation signal and adapted to receive a feedback signal;
power amplifier circuitry adapted to amplify the phase modulation signal based on a variable supply voltage to provide an output signal;
power control circuitry adapted to provide the variable supply voltage based on the amplitude modulation signal;
feedback circuitry adapted to provide a signal corresponding to the output signal of the power amplifier circuitry; and
switching circuitry coupled to an output of the feedback circuitry to receive the signal corresponding to the output signal of the power amplifier circuitry and coupled to an output of a voltage controlled oscillator (VCO) of the PLL providing the phase modulation signal and adapted to provide the signal corresponding to the output signal of the power amplifier circuitry to the PLL as the feedback signal when operating in the closed loop mode of operation and provide the output of the VCO as the feedback signal when operating in the open loop mode of operation.

2. The system of claim 1 wherein the feedback circuitry is coupled to an output of the power amplifier circuitry in order to provide the signal corresponding to the output signal of the power amplifier circuitry such that the power amplifier circuitry is enclosed within the PLL when operating in the closed loop mode of operation.

3. The system of claim 1 wherein the feedback circuitry comprises coupling circuitry adapted to couple an output of the power amplifier circuitry to the switching circuitry, thereby providing the signal corresponding to the output signal to the switching circuitry.

4. The system of claim 1 wherein the polar modulator comprises:
a digital mapping module adapted to receive digital data and convert the digital data into a digital quadrature signal having an in-phase component and a quadrature component;
a digital polar converter adapted to receive the digital quadrature signal and convert the digital quadrature signal into a digital polar signal having an amplitude component and a phase component;
first circuitry adapted to provide the amplitude modulation signal based on the amplitude component;
second circuitry adapted to provide a digital frequency deviation signal based on the phase component; and
the PLL further adapted to provide the phase modulation signal based on the digital frequency deviation signal, the feedback signal, and a reference signal.

5. The system of claim 4 wherein the first circuitry comprises compensation circuitry adapted to pre-distort the amplitude component to compensate for an amplitude modulation to amplitude modulation (AM/AM) distortion of the power amplifier circuitry, thereby providing a compensated amplitude component, wherein the amplitude modulation signal is provided based on the compensated amplitude component.

6. The system of claim 4 wherein the second circuitry comprises compensation circuitry adapted to pre-distort the phase component to compensate for an amplitude modulation to phase modulation (AM/PM) distortion of the power amplifier circuitry, thereby providing a compensated phase component, wherein the digital frequency deviation signal is provided based the compensated phase component.

7. The system of claim 1 wherein the PLL is a fractional-N phase locked loop (FN-OPLL).

8. The system of claim 7 wherein the FN-OPLL has a loop bandwidth greater than or equal to 800 kHz.

9. The system of claim 1 wherein the polar transmitter is further adapted to operate according to the Global System for Mobile Communication (GSM) Enhanced Data rates for GSM Evolution (EDGE) standard.

10. The system of claim 9 wherein the predetermined threshold is in a range including +10 dBm to +15 dBm.

11. A method comprising:
providing a polar transmitter adapted to operate in either an open loop mode of operation or a closed loop mode of operation wherein providing the polar transmitter comprises:
providing a polar modulator adapted to modulate data to provide an amplitude modulation signal and a phase modulation signal, the polar modulator comprising a phase locked loop (PLL) providing the phase modulation signal and adapted to receive a feedback signal;
providing power amplifier circuitry adapted to amplify the phase modulation signal based on a variable supply voltage to provide an output signal;
providing power control circuitry adapted to provide the variable supply voltage based on the amplitude modulation signal;
providing a signal corresponding to the output signal of the power amplifier circuitry to the PLL as the feedback signal when operating in the closed loop mode of operation; and
providing an output of a voltage controlled oscillator (VCO) of the PLL to the PLL as the feedback signal when operating in the open loop mode of operation; and operating the polar transmitter in the open loop mode of operation when an output power level of the polar transmitter is below a predetermined threshold; and operating the polar transmitter in the closed loop mode of operation when the output power level is above the predetermined threshold.

12. The method of claim 11 wherein providing the polar modulator comprises:

providing a digital mapping module adapted to receive digital data and convert the digital data into a digital quadrature signal having an in-phase component and a quadrature component;

providing a digital polar converter adapted to receive the digital quadrature signal and convert the digital quadrature signal into a digital polar signal having an amplitude component and a phase component;

providing first circuitry adapted to provide the amplitude modulation signal based on the amplitude component;

providing second circuitry adapted to provide a digital frequency deviation signal based on the phase component; and providing the PLL adapted to provide the phase modulation signal based on the digital frequency deviation signal, the feedback signal, and a reference signal.

13. The method of claim 12 wherein providing the first circuitry comprises providing compensation circuitry adapted to pre-distort the amplitude component to compensate for an amplitude modulation to amplitude modulation (AM/AM) distortion of the power amplifier circuitry, thereby providing a compensated amplitude component, wherein the amplitude modulation signal is provided based the compensated amplitude component.

14. The method of claim 12 wherein providing the second circuitry comprises providing compensation circuitry adapted to pre-distort the phase component to compensate for an amplitude modulation to phase modulation (AM/PM) distortion of the power amplifier circuitry, thereby providing a compensated phase component, wherein the digital frequency deviation signal is provided based the compensated phase component.

15. The method of claim 11 wherein providing the polar transmitter further comprising providing the polar transmitter such that the polar transmitter operates according to the Enhanced Data rates for GSM Evolution (EDGE) standard.

16. The method of claim 15 further comprising selecting the predetermined threshold from a range including +10 dBm to +15 dBm.

* * * * *